United States Patent [19]
Martin

[11] Patent Number: 5,313,361
[45] Date of Patent: May 17, 1994

[54] CERAMIC SUBSTRATE

[75] Inventor: Jacob H. Martin, Wellesley, Mass.

[73] Assignee: The Charles Stark Draper Laboratory, Inc., Cambridge, Mass.

[21] Appl. No.: 38,028

[22] Filed: Mar. 29, 1993

[51] Int. Cl.⁵ .............................................. H05K 7/20
[52] U.S. Cl. .................................. 361/699; 165/80.3; 174/252; 257/714; 361/748
[58] Field of Search ............................... 165/80.3, 185; 174/16.3, 15.1, 15.2, 252; 257/714, 723, 724; 361/381–389, 397, 414

[56] References Cited
U.S. PATENT DOCUMENTS 4,631,636 12/1986 Andrews ........................... 361/382
4,774,630 9/1988 Reisman et al. .................... 257/714

Primary Examiner—Gregory D. Thompson
Attorney, Agent, or Firm—Joseph S. Iandiorio

[57] ABSTRACT

An improved ceramic substrate for supporting, cooling and interconnecting components on both surfaces of a substrate includes a plurality of coolant carrying channels separated by fins and extending through the substrate generally parallel to the surfaces of the substrate; and a plurality of routed vias for interconnecting component terminations on opposite surfaces of the substrate which are not aligned with each other and with a fin; each routed via includes an internal via extending through a fin and a surface blind via extending inwardly from each surface, and at least one transverse segment interconnecting one end of the internal via to one of the surface blind vias.

6 Claims, 3 Drawing Sheets

CERAMIC SUBSTRATE

FIELD OF INVENTION

This invention relates to an improved ceramic substrate for supporting, cooling and interconnecting components on both surfaces of the substrate.

BACKGROUND OF INVENTION

Conventional hybrid circuits usually have about 10% to 20% of their surface covered with integrated circuits. These circuits are electrically interconnected by wiring in the remaining portion of the surface and in a number of layers beneath it. The wiring width is typically 5–10 mils. By reducing this to 0.5–1 mil in width as in the multichip module technology (MCM) the area required for the interconnections, using the same number of layers, could be reduced by a factor of 100 to 1. However, since a portion of surface area is occupied by the integrated circuits and is not reduced with the wiring, there is a limit to how much the area can be reduced. While the area reduction therefore has a limit, further efficiency can be effected by eliminating one or more of the layers. Now integrated circuit chips can be packed as closely as permitted by assembly technique and repair access. In some cases the chips can be extremely close, leaving only enough separation to allow a faulty chip to be removed and replaced. With such high density packing of the integrated circuits there is increased need for heat dissipation through the ceramic substrate support to a suitable heatsink. The heat problem is compounded when there are circuit components on both sides of the ceramic support, for example, where passive components are on the opposite side from associated silicon based circuitry. A number of heat dissipation approaches are available but each has shortcomings. A high thermal conductivity material for the ceramic support, such as beryllia or aluminum nitride permits better lateral thermal conduction. But this limits the size of the overall circuit because the temperature rise at the center of the circuit relative to the edges is dependent upon the size and power dissipation per unit area. Another approach is to use high thermal conductivity blocks attached between a heat sink and the ceramic substrate support opposite the location of high power components. But it takes up considerable space that would be better used for components. A third approach is to attach the heat sink to the integrated circuit chip side, in a "chips-first" multichip module integrated circuit, but this requires that the heat be conducted through organic insulators which are not good thermal conductors. Also, immersion cooling can be used with all of its attendant problems.

A second problem which occurs as a result of the high packing density of the integrated circuit chips is that the location of the vias is restricted to being in the small spaces between the chips. This further complicates the process when the components on the opposite side cannot be aligned with the appropriate vias.

SUMMARY OF INVENTION

It is therefore an object of this invention to provide an improved ceramic substrate for supporting electronic components.

It is a further object of this invention to provide such an improved ceramic substrate which cools and interconnects components on both surfaces.

It is a further object of this invention to provide such an improved ceramic substrate which cools through the use of coolant carrying channels separated by fins in the substrate.

It is a further object of this invention to provide such an improved ceramic substrate which interconnects components terminals on opposite surfaces of the substrate which are not aligned with each other and with a fin.

The invention results from the realization that a truly compact and efficient substrate for supporting, cooling and interconnecting components on both sides of the substrate can be effected by providing coolant carrying channels with fins between them extending through the substrate and using routed vias which extend into the substrate from each surface, extend transversely across one or more channels and/or along a channel proximate one or both surfaces and extend through a fin.

This invention features an improved ceramic substrate for supporting, cooling and interconnecting components on both surfaces of the substrate. There is a plurality of coolant carrying channels separated by fins and extending through the substrate generally parallel to surfaces of the substrate. A plurality of routed vias interconnect the component terminations on opposite surfaces of the substrate which are not aligned with each other and with a fin. Each of the routed vias includes an internal via extending through a fin, a surface blind via extending inwardly from each surface, and at least one transverse segment interconnecting one end of the internal via to one of the surface blind vias.

In a preferred embodiment the other of the surface blind vias may be aligned with the internal via, or there may be a second transverse segment interconnecting the other end of the internal via with the other surface of the blind via. The transverse segment may extend across more than one channel, may extend along a channel, or along a channel and across at least one channel.

DISCLOSURE OF PREFERRED EMBODIMENT

Other objects, features and advantages will occur to those skilled in the art from the following description of a preferred embodiment and the accompanying drawings, in which.

DETAILED DESCRIPTION

Figure 1:
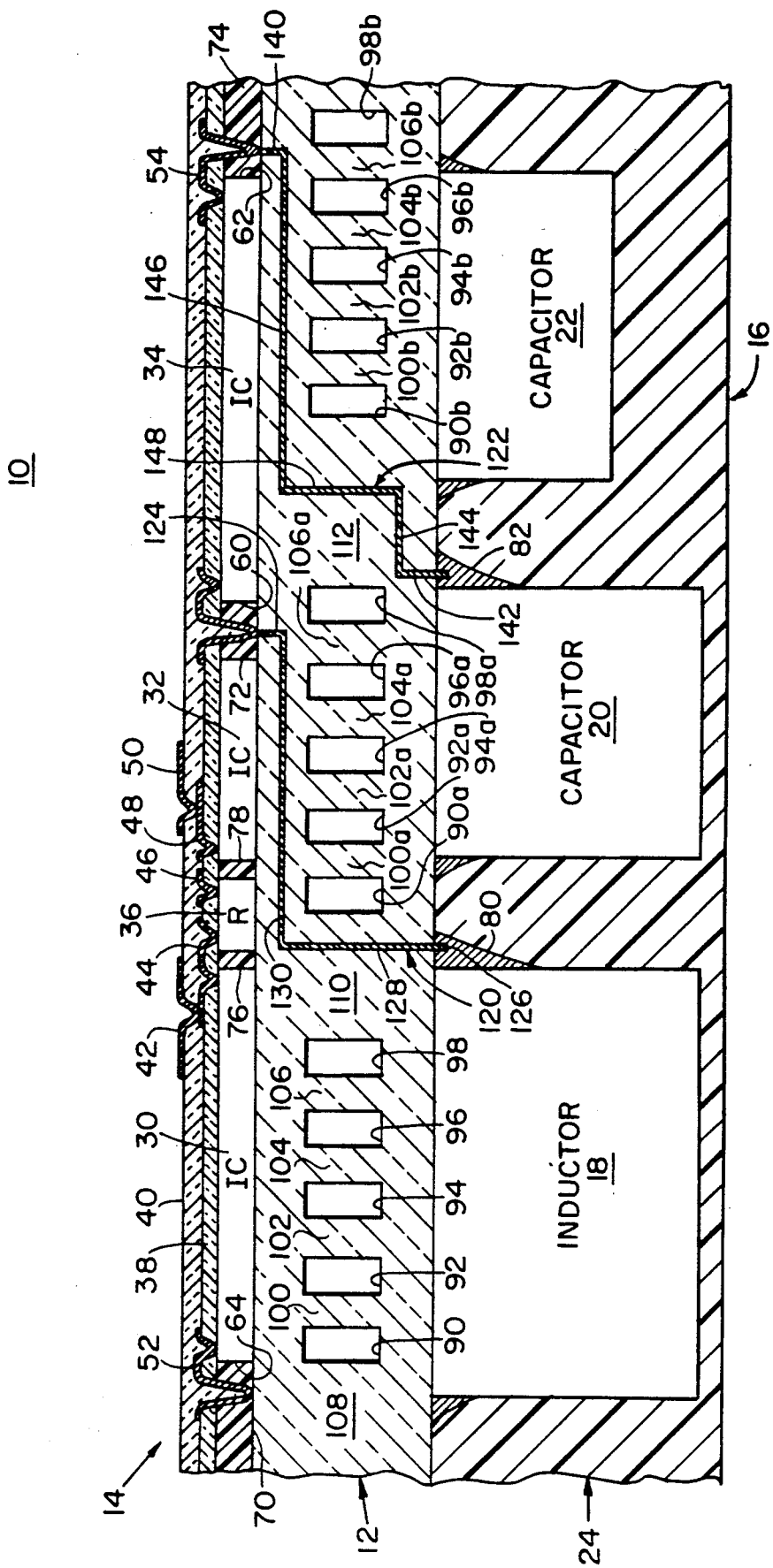
FIG. 1 is a side sectional diagrammatic view of an improved ceramic substrate showing the coolant channels and routed vias according to this invention.

There is shown in FIG. 1 a double-sided multichip module (MCM) 10 including a substrate 12 according to this invention having a multichip module structure 14 on one side and passive components 16 such as inductor 18, and capacitors 20 and 22, mounted on the other side potted in epoxy 24. The multichip module structure is a chip first construction, which means that the integrated circuits 30, 32 and 34, as well as passive components such as resistor 36, are mounted first on substrate 12, after which there are one or more wiring layers 38 and 40 laid down. Wiring layers 38 and 40 are formed of polyamide insulating material and typically copper interconnects as shown at 42, 44, 46, 48, 50, 52 and 54. Component terminations 60, 62 and 64 are formed between integrated circuits and bounded by insulators 70, 72 and 74, usually formed of epoxy or other organic material. Insulator 76 and 78 surrounding resistor 36 are also formed of epoxy. Component terminations on the back side of substrate 12 may be formed by solder or conductive epoxy fillets 80 and 82 for example.

The various interconnects 42-54 as well as component terminations 60-64 are formed of copper, preferably with a barrier layer such as titanium when polyamide is used as the insulator. Interconnects may also be aluminum or other metals.

Substrate 12 may be made of various alumina formulations from low to high fire, and according to this invention includes a plurality of coolant channels 90-98 separated by fins 100-106. Coolant channels 90-98 are typically 30 mils high and 10 mils wide and separated by fins 100-106 which are roughly 10 mils wide. The coolant channels need not be evenly spaced but may be arranged in groups which are separated by larger fins such as fins 108, 110 and 112 that are larger than the interstitial fins and may be 20 or 30 mils across. The other groups of coolant channels and their interstitial fins have been given like numbers with lower case a and b. In this way the increased heat produced by the close packing density of the integrated circuits in the multichip module structure 14 and the heat generated by the passive components 18, 20, 22, is easily accommodated by passing an appropriate coolant fluid through the coolant channels. However, in solving the cooling problem a second problem arises, which is the difficulty in connecting together components on opposite sides of substrate 12 when the component are not conjunctively aligned with each other and with a fin between collection channels. For this purpose according to this invention, routed vias 120, 122 are constructed. Routed via 120 includes blind via 124 connected to component termination 60 and blind via 126 connected to component termination 80. The routed via also includes a transverse segment 130 and an internal via 128 which interconnect blind via 124 with blind via 126. Routed vias can take a variety of different forms. For example, routed via 122 includes blind via 140 which connects to component termination 62 and blind via 142 which connects to component termination 82. In between the two blind vias are two transverse segments 144 and 146 which connect respectively to the blind vias 142 and 140, and an internal via 148 which interconnects to both transverse segments 146 and 144.

Figure 2:
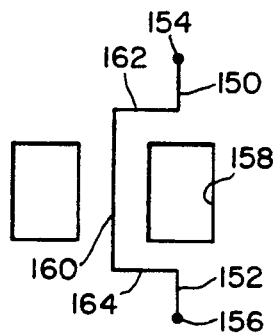
FIGS. 2, 3 and 4 are schematic diagrams showing various configurations for routed vias according to this invention.
Figure 3:
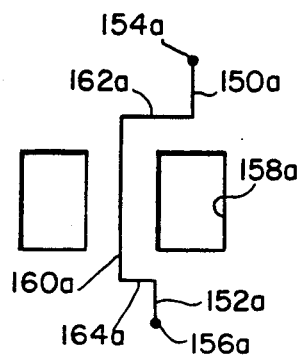
Figure 4:
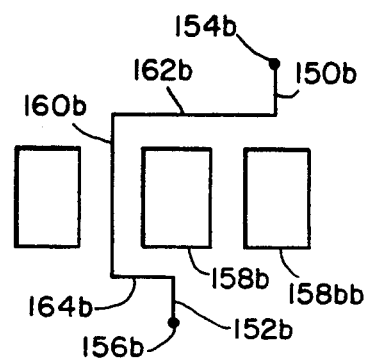

Various other constructions are possible as well. For example, as shown in FIG. 2, even though the blind vias 150 and 152 are aligned with the component terminations 154 and 156, respectively, they cannot be connected straight through as conventionally because a coolant channel 158 is blocking the way. In this case an internal via 160 and two transverse segments 162 and 164 solve the problem of connection. In FIG. 3 another routing is shown, wherein the component terminals 154a and 156a are not aligned and there is a channel 158a which must be avoided. Here again a pair of transverse segments 164a and 162a interconnecting blind vias 150a and 152a with internal via 162a are used to avoid channel 158a and make the connection. More than one channel can be avoided, as shown in FIG. 4, where channel 158b and 158bb have been avoided using transverse segments 162b and 164b in conjunction with internal via 160b to interconnect blind vias 150b and 152b and thereby make the connection between component terminations 154b and 156b. Routed vias may be made of gold when the substrate is made of low-fire alumina, or tungsten when the substrate is made out of aluminum oxide, $Al_2O_3$.

Figure 5:
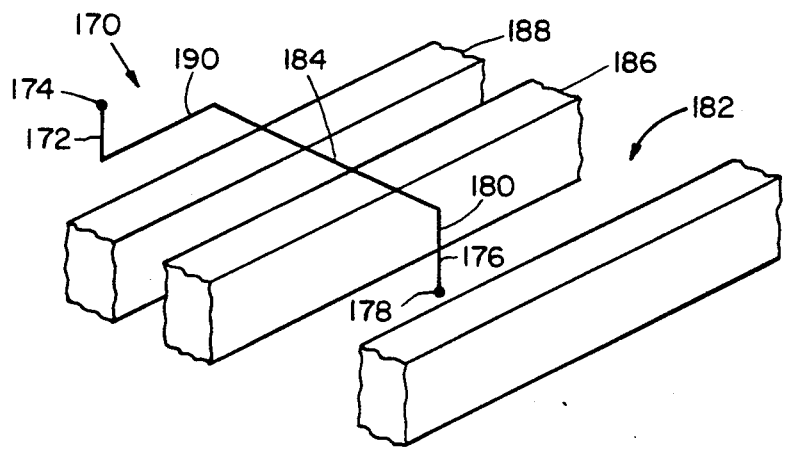
FIG. 5 is a three-dimensional diagrammatic view similar to FIGS. 2–4 but showing a more complicated three-dimensional path for a routed via.

Although thus far the routed vias have been shown as two-dimensional in nature, this is not a necessary limitation of the invention, for as shown in FIG. 5, routed via 170 can employ blind via 172 connected to component terminator 174 on one side of the substrate, and a blind via 176 which connects to a component terminator 178 on the other side of the substrate. Interconnecting the two blind vias 172 and 176 is an internal via 180 in enlarged fin 182, and two transverse segments. The first transverse segment 184 crosses over coolant channels 186 and 188, and a second transverse segment 190 extends from transverse segment 184 to blind via 172.

Figure 6:
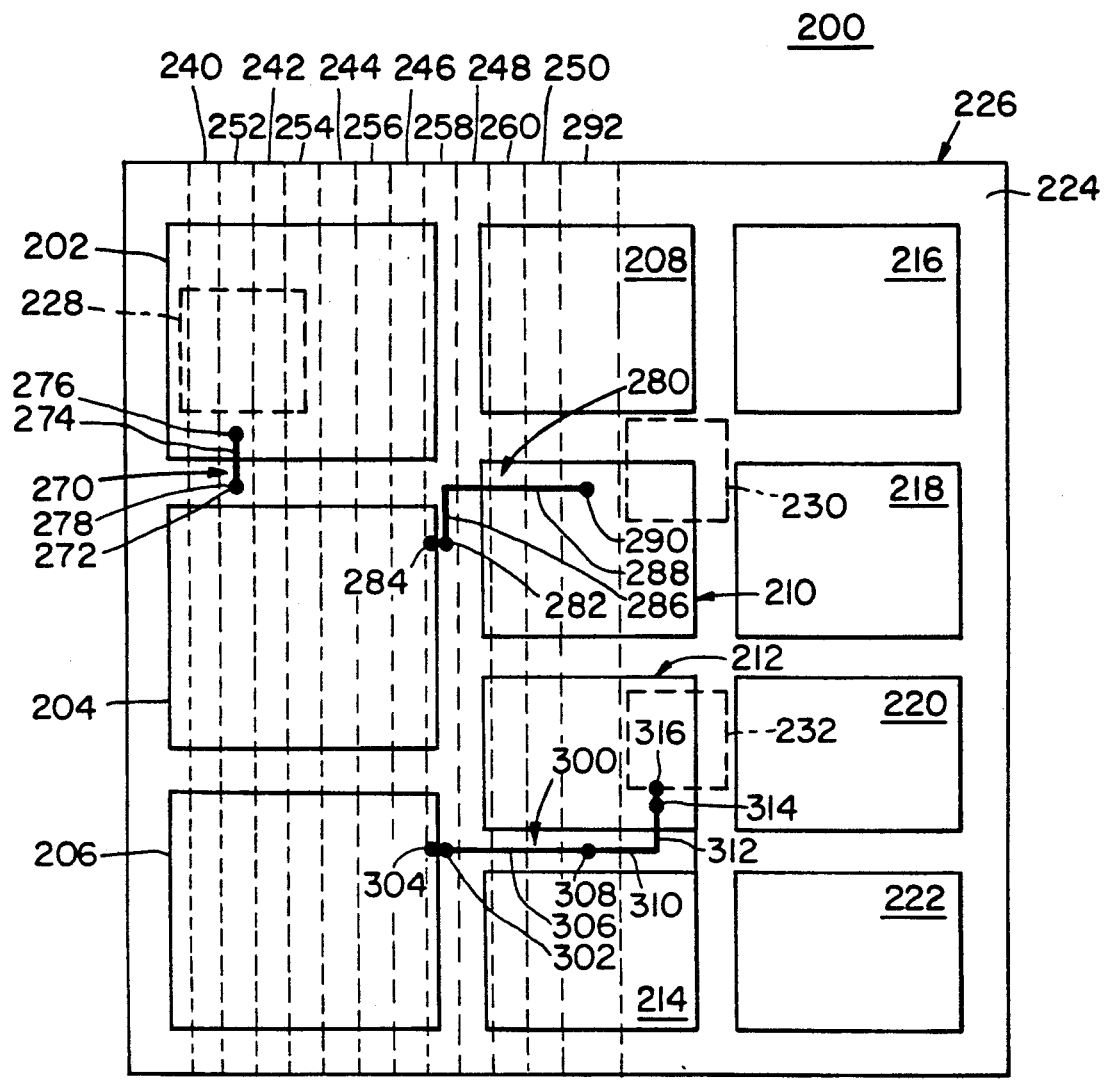
FIG. 6 is a top plan view of a multichip module structure showing coolant channels and a number of different three-dimensional routed vias according to this invention.

Further examples of such routed vias are shown in FIG. 6, where multichip module structure 200 includes a plurality of integrated circuits 202, 204, 206, 208, 210, 212, 214, 216, 218, 220 and 222, mounted on the top side 224 of substrate 226, and a number of additional components shown in phantom, 228, 230 and 232, mounted on the back side of substrate 226. Channels 240, 242, 244, 246, 248, 250 extend through substrate 226 separated by fins 252, 254, 256, 258 and 260. By way of example, the first routed via 270 includes blind via 272 which extends directly into the drawing plane, as shown in FIG. 6, a transverse segment 274 which runs along fin 252, and a blind via 276. Blind via 272 interconnects with a component termination 278 on the top surface of substrate 276 while blind via 276 interconnects with a component termination, not shown, on the back surface of substrate 276.

Routed via 280 includes blind via 282 which contacts component termination 284 of integrated circuit 204 on the top surface of substrate 226 and then interconnects with transverse segment 286 which in turn connects with a second transverse segment 288. Segment 286 runs along on top of channel 248. Segment 288 crosses channel 248 and 250 and connects with internal via 290 in enlarged fin 292. Internal via 290 is aligned with and connects directly with a blind via, not visible, in FIG. 6, which then connects to a component termination, not visible, of component 230 on the back side of substrate 226. A third routed via 300 includes blind via 302 that connects to component termination 304 of integrated circuit 206, blind via 302 that connects with transverse segment 306 which extends across channel 250, and connects to internal via 308 that extends through enlarged fin 292. On the far side of fin 292, internal via 308 connects with transverse segment 310 which interconnects with a third transverse segment 312 that is interconnected with a blind via 314 on the back surface of support substrate 226. There blind via 314 connects with component termination 316 of circuit 232.

Although specific features of this invention are shown in some drawings and not others, this is for convenience only as some feature may be combined with any or all of the other features in accordance with the invention.

Other embodiments will occur to those skilled in the art and are within the following claims:

What is claimed is:

1. An improved ceramic substrate for supporting, cooling and interconnecting components disposed on opposite surfaces of the substrate, comprising:

a plurality of coolant carrying channels separated by fins and enclosed within the interior of said substrate between the components on opposite surfaces and extending through said substrate generally parallel to said surfaces of said substrate; and a plurality of routed vias for interconnecting said components disposed on opposite surfaces of the substrate by component terminations which are not aligned with each other and with a fin, each said routed via including an internal via extending through a fin, a surface blind via extending inwardly from each surface, and at least one transverse segment interconnecting one end of said internal via to one of said surface blind vias.

2. The improved ceramic substrate for supporting cooling and interconnecting components disposed opposite on surfaces of the substrate of claim 1 in which the other of said surface blind vias is aligned with said interconnect via.

3. The improved ceramic substrate for supporting cooling and interconnecting components disposed on opposite surfaces of the substrate of claim 1 in which there is a second transverse segment interconnecting the other end of said internal via with the other surface blind via.

4. The improved ceramic substrate for supporting, cooling and interconnecting components disposed on opposite surfaces of the substrate of claim 1 in which at least one of said transverse segments extends across more than one channel.

5. The improved ceramic substrate for supporting, cooling and interconnecting components disposed on opposite surfaces of the substrate of claim 1 in which at least one of said transverse segments extends along a said channel and across at least one channel.

6. The improved ceramic substrate for supporting, cooling and interconnecting components disposed on opposite surfaces of the substrate of claim 1 in which at least one of said transverse segments extends along a said channel.

* * * * *